United States Patent [19]

Slough

[11] Patent Number: 4,642,559
[45] Date of Patent: Feb. 10, 1987

[54] ELECTROSTATIC FIELD METER

[75] Inventor: Carlton M. Slough, Spring, Tex.

[73] Assignee: Texaco, Inc., White Plains, N.Y.

[21] Appl. No.: 560,675

[22] Filed: Dec. 12, 1983

[51] Int. Cl.$^4$ ............................................. G01R 31/02
[52] U.S. Cl. ..................................... 324/72; 324/457; 324/72.5
[58] Field of Search ................. 324/457, 458, 109, 72, 324/72.5, 120, 123 R, 118; 330/10

[56] References Cited

U.S. PATENT DOCUMENTS 3,421,982 1/1969 Schultz ................................. 324/119
3,828,250 8/1974 Buser et al. ............................ 324/72

OTHER PUBLICATIONS

R. Yair, "Charge Sampling Method for Low Current Measurements", Rev. Sci. Instru. vol. 45, No. 3, Mar. 1974, pp. 395–399.

Primary Examiner—Michael J. Tokar
Attorney, Agent, or Firm—Robert A. Kulason; Ronald G. Gillespie

[57] ABSTRACT

An electrostatic field meter includes a field head which develops an electrical charge representative of the strength of an electrostatic field at the location of the field head. The electrical charge is converted to an AC signal which is then provided to metering apparatus. The metering apparatus provides an indication of the strength of the electrostatic field in accordance with the AC signal.

8 Claims, 2 Drawing Figures 4,642,559

1

ELECTROSTATIC FIELD METER

BACKGROUND OF THE INVENTION

Field of the Invention

The present invention relates to meters in general and, more particularly, to electrostatic field meters.

SUMMARY OF THE INVENTION

An electrostatic field meter includes a field head which develops an electrical charge representative of the strength of an electrostatic field at the location of the field head. The electrical charge is converted to an AC signal which is then provided to metering apparatus. The metering apparatus provides an indication of the strength of the electrostatic field in accordance with the AC signal.

The objects and advantages of the invention will appear more fully hereinafter from a consideration of the detailed description which follows, taken together with the accompanying drawings, wherein one embodiment of the invention is illustrated by way of example. It is to be expressly understood, however, the drawings are for illustration purposes only and are not to be construed as defining the limits of the invention.

DESCRIPTION OF THE INVENTION

Figure 1:
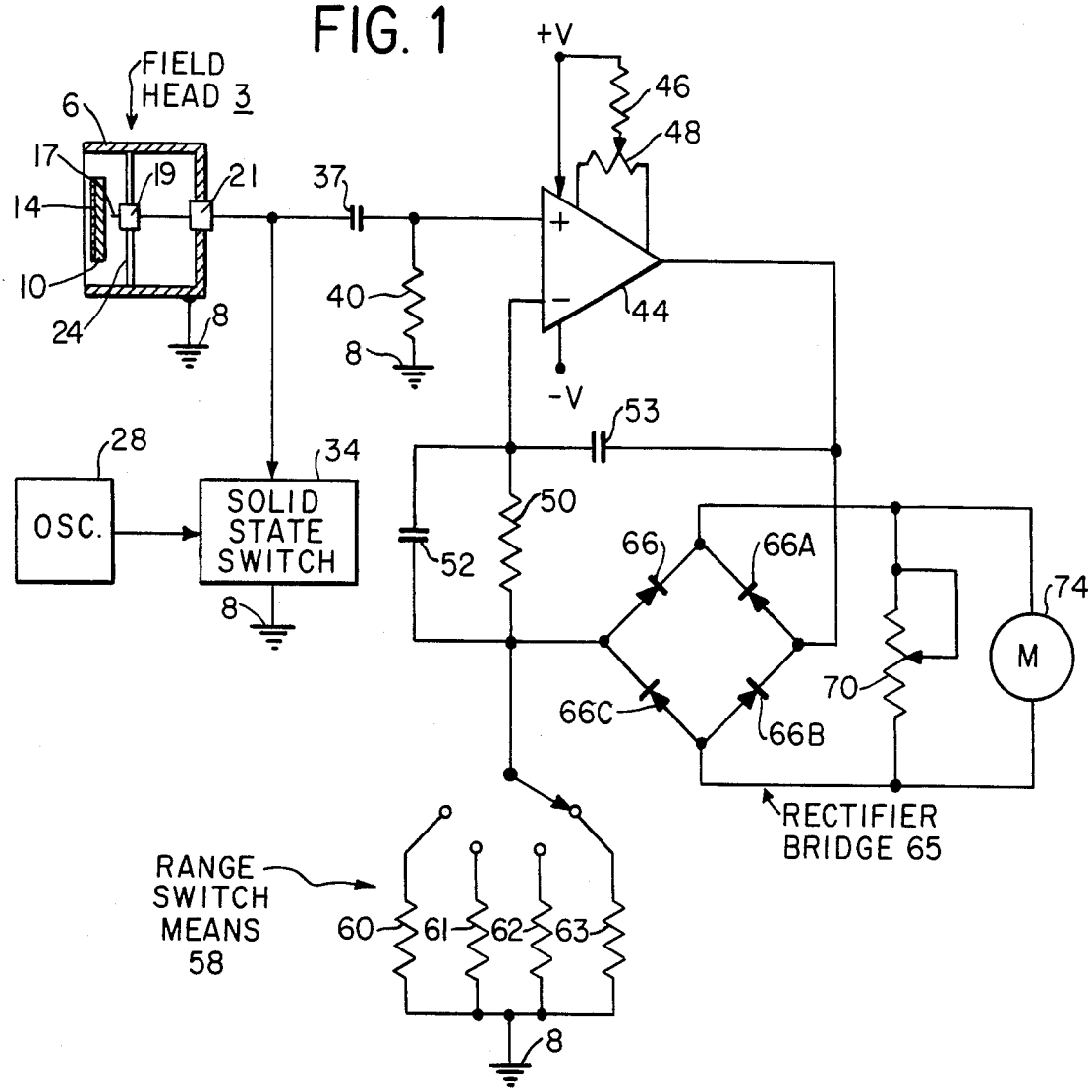
FIG. 1 is a partial simplified block diagram and a partial schematic of an electrostatic field meter constructed in accordance with the present invention.

Referring to FIG. 1, a field head 3 includes a shield 6 made of metal and connected to a ground 8. An insulator 10 has a metalized surface 14. Because of the shielding affects of shield 6, an electrostatic field may only be sensed in the unshielded direction. When the metalized surface 14 is exposed to the electrostatic field, a charge will accumulate on surface 14. The amount of charge on surface 14 is proportional to the field strength. A conductor 17 is connected to the metalized surface 14 and passes through insulators 10, 19 and 21. Insulator 19 allows a support member 24 to be used to support insulator 10, and hence surface 14, in position while passing through conductor 17 without electrical connection to shield 6.

Insulator 21 also permits conductor 17 to pass through without electrical connection to shield 6. An oscillator 28 provides a continuous square wave voltage at a predetermined frequency to a solid state switch 34. Oscillator 28 may be of a conventional type and may provide the square wave at a 5 volt magnitude. The solid state switch 34 may actually represent a plurality of switches so as to share the current resulting from the discharge of the electrical charge on conductor 17 as hereinafter explained. Solid state switch 34 is connected to conductor 17 and to ground 8. In operation, the square wave from oscillator 28 effectively opens and closes switch 34 on a periodic basis. When in the open state, conductor 17 builds up to the charge on the metalized surface 14 of insulator 10. When switch 34 is closed the charge on conductor 17 is discharged to ground, that is to zero. The opening and closing of switch 34 in effect creates an AC signal from the charge on surface 14 whose magnitude is the same as the magnitude of the charge on surface 14. The AC signal passes through a blocking capacitor 37 which is developed as a voltage across resistor 40. The voltage appearing at the connection of capacitor 37 and resistor 40 is applied to a "+" input of an operational amplifier 44. Operational amplifier 44 receives a +V biasing voltage which is also applied through the resistor 46 to a potentiometer 48 connected across terminals of amplifier 44. The arrangement of resistor 46 and potentiometer 48 provides adjustment for offset null.

Amplifier 44 also receives a negative −V biasing voltage. A "−" input of amplifier 44 is connected to a resistor 50 and capacitors 52 and 53. Capacitor 52 is connected across resistor 50 and resistor 50 is also connected to a range switching means 58 including range resistors 60, 61, 62, 63, having a common connection to ground 8.

The output of amplifier 44 is connected to the unconnected end of capacitor 53 and to a rectifying bridge 65 including diodes 66, 66A, 66B, and 66C. The common connection of resistor 50, capacitor 52 and range switch 58 is connected to rectifier bridge 65 so that last mentioned connection and the output of amplifier 44 are in effect connected to the inputs of rectifier bridge 65. The outputs of rectifier bridge 65 are connected across a potentiometer 70 and a microammeter 74.

Thus in operation the signal that passes through capacitor 37 is amplified by amplifier 34 and is subsequently rectified by rectifier bridge 65 and resistor 50 and capacitor 52 to provide a rectified signal to meter 74. Ranges may be selected by use of range switch means 58 which changes the value of resistance connected between the "−" terminal of amplifier 44 and ground 8 so as to affect the amplitude of the output signal provided by amplifier 44.

Figure 2:
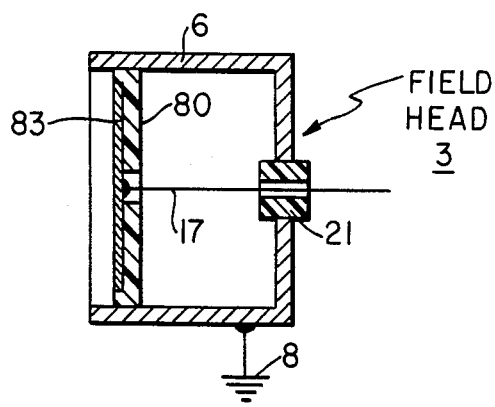
FIG. 2 shows another variation of the field head shown in FIG. 1.

With reference to FIG. 2, there is shown another variation of field head 3 in which elements 6, 17, 21, and ground 8 are the same, or similar to, as shown in FIG. 1. However, in this variation there is a new insulator 80 in lieu of insulator 10 which extends from one side of shield 6 to the other side of shield 6 and has embedded in it a metal disc or metallic surface 83 in such a manner that disc 83 does not contact shield 6.

All of the foregoing can be housed in a housing (not shown) designed to be hand held so that a person may carry this meter into the presence of an electrostatic field and use it to determine the strength of that field.

The present invention as hereinbefore described is a hand held electrostatic field meter.

What is claimed is:

1. A hand holdable electrostatic field meter comprising:
    head means for deriving an electrical charge representative of the direction and strength of an electrostatic field in the presence of the electrostatic field,
    converting means for converting the electrical charge to an AC signal,
    means for providing an indication of the strength of the electrostatic field in accordance with the AC signal from the converting means, and
    a housing for housing all of the elements in a manner so that the meter may be hand held.

2. A meter as described in claim 1 in which the converting means includes:
    switch means for passing the electrical charge to ground when in an on state and for not passing the charge to ground when in an off state, and oscillator means for providing an AC signal to the switch means so as to repetitively change the state of switch means.

3. A meter as described in claim 2 in which the indication means includes:

a blocking capacitor receiving the AC signal, operational amplifier means for amplifying the AC signal which has passed through the blocking capacitor, means for rectifying the signal from the operational amplifier means, and a microammeter which receives the rectified signal from the rectifying means and provides the indication of the electrostatic field strength in accordance with the rectified signal.

4. A meter as described in claim 3 further comprising: means connected to the operational amplifier means and to the rectifier means for controlling the range of readings by the meter.

5. A meter as described in claim 4 in which the head means includes:

shielding means for providing an electrostatic shield from all directions but one, means spatially arranged within the shield means for developing a charge representative of the electrostatic field, and means connected to the developing means, to the switching means and to blocking capacitor for conducting the developed charge to the switching means and to the blocking capacitor.

6. A meter as described in claim 4 in which the developing means is held rigidly in place within the shield means by a support member.

7. A meter as described in claim 6 in which the developing means includes:

an insulator member having a metalized surface which is exposed to the electrostatic field, and in which the conducting means conducts the charge developed on the metalized surface through the insulator member to the switching means and to the blocking capacitor.

8. A meter as described in claim 6 in which the developing means includes:

an insulator member that is in contact with all sides of the shield save one, and a metal disc embedded in said insulator member in a manner so that it is exposed to the electrostatic field and does not make contact with the shield means.

* * * * *